(12) United States Patent
Bohnert et al.

(10) Patent No.: US 7,692,420 B2
(45) Date of Patent: Apr. 6, 2010

(54) FIBER-OPTIC CURRENT SENSOR WITH POLARIMETRIC DETECTION SCHEME

(75) Inventors: Klaus Bohnert, Oberrohrdorf (CH); Andreas Frank, Zurich (CH); Hubert Brandle, Oberengstringen (CH)

(73) Assignee: ABB Research Ltd. (CH)

( * ) Notice: Subject to any disclaimer, the term of this patent is extended or adjusted under 35 U.S.C. 154(b) by 0 days.

(21) Appl. No.: 12/256,289

(22) Filed: Oct. 22, 2008

(65) Prior Publication Data

US 2009/0039866 A1    Feb. 12, 2009

Related U.S. Application Data

(63) Continuation of application No. PCT/CH2006/000227, filed on Apr. 25, 2006.

(51) Int. Cl.
*G01R 31/00* (2006.01)

(52) U.S. Cl. .................... 324/96; 324/753; 356/72; 385/12

(58) Field of Classification Search ............. 324/96–97, 324/753; 250/225; 356/72; 359/281; 385/12
See application file for complete search history.

(56) References Cited

U.S. PATENT DOCUMENTS

| | | | |
|---|---|---|---|
| 4,442,350 A | | 4/1984 | Rashleigh |
| 4,564,754 A | | 1/1986 | Sato et al. |
| 5,696,858 A | * | 12/1997 | Blake .................. 385/12 |
| 6,122,415 A | * | 9/2000 | Blake .................. 385/12 |
| 6,265,862 B1 | * | 7/2001 | Menke ................ 324/96 |
| 6,504,355 B2 | * | 1/2003 | Minier ................ 324/96 |

FOREIGN PATENT DOCUMENTS

| | | |
|---|---|---|
| DE | 3116149 A1 | 11/1982 |
| DE | 3931542 A1 | 4/1991 |
| EP | 0856737 A1 | 8/1998 |
| EP | 1115000 A2 | 7/2001 |
| EP | 1174719 A1 | 1/2002 |
| EP | 1512981 A1 | 3/2005 |
| WO | 0019217 A1 | 4/2000 |

OTHER PUBLICATIONS

Erdogan, T, et al. Characterization of UV-induced Birefringence in Photosensitive Ge-doped Silica Optical Fibers, Journal of the Optical Society of America B/vol. 11, No. 10, Oct. 1994, 6 Pages.

(Continued)

*Primary Examiner*—Ha Tran T Nguyen
*Assistant Examiner*—Arleen M Vazquez
(74) *Attorney, Agent, or Firm*—St. Onge Steward Johnston & Reens LLC

(57) ABSTRACT

The current in a conductor is measured by exploiting the Faraday effect in a sensing fiber. The light returning from the sensing fiber is split into at least two parts, at least one of which is analyzed by a first circular analyzer for generating a first signal. A second part may e.g. be analyzed by a second circular analyzer, and a third part may be analyzed by a linear analyzer. By combining the signals obtained in this way, the current induced phase delay in the returning light can be measured efficiently and accurately.

17 Claims, 1 Drawing Sheet

OTHER PUBLICATIONS

Burns, William, Degree of Polarization in the Lyot Depolarizer, Journal of Lightwave Technology. vol. LI-1, No. 3, Sep. 1983, 4 Pages.
International Preliminary Report on Patentability, Jul. 28, 2008, 9 Pages.
International Search Report and Written Opinion of the International Searching Authority, PCT/CH2006/000227, Jan. 22, 2007, 12 Pages.

Murphy, Edmond J, et al., Low-loss coupling of Multiple Fiber Arrays to Single-Mode Waveguides, Jornal of Lightwave Technology, vol. LI-1, No. 3, Sep. 1983, 4 Pages.
Bohnert, K, et al., Temperature and Vibration Insensitive Fiber-Optic Current Sensor, Journal of Lightwave Technology, vol. 20, No. 3., Feb. 2002, 10 pages.

* cited by examiner

FIBER-OPTIC CURRENT SENSOR WITH POLARIMETRIC DETECTION SCHEME

CROSS-REFERENCE TO RELATED APPLICATIONS

The present application is a continuation of pending International patent application PCT/CH2006/000227 filed on Apr. 25, 2006, which designates the United States and the content of which is incorporated herein by reference.

FIELD OF THE INVENTION

The invention relates to the field of measurement of electrical currents using the propagation of light waves in an optical fiber under influence of the Faraday effect.

BACKGROUND OF THE INVENTION

The measurement of currents using light waves in an optical fiber wound around a conductor has e.g. been described in EP 856 737.

In this device, two orthogonal, linearly polarized light waves are sent through an electro-optic phase modulator for introducing an ac phase modulation and then over a polarization maintaining fiber (PMF) to a site of measurement, where they are converted by a retarder to two circularly polarized light waves of opposite orientation. These circularly polarized light waves pass through a measuring fiber wound around a conductor. At the end of the measuring fiber, a reflector sends the light waves back to the retarder, where they are converted back to two linearly polarized light waves. The returning light from the retarder is separated from the original light in a beam splitter and sent to a detector.

Alternatively, devices based on fiber gyro modules can be used.

SUMMARY OF THE INVENTION

It is an object of the present invention to provide method that allows to measure the current accurately and with simple means.

This object is achieved by the method of claim 1. Accordingly, the returning light is split into two or more parts. A first part is passed through a circular analyzer and then measured by a first detector. A second part fed to a second detector. The second part of the light can be analyzed in a manner different from the first part, e.g. by a circular analyzer of opposite direction, or by a linear analyzer, or it can be passed directly (without passing through any polarizer) to the second detector. Hence, the method allows to determine two or more characteristic parameters of the returning light, which allows to obtain a more accurate result easily. No ac phase modulators are required.

The term "analyzer" designates an optical device that lets a given polarization pass to the detector while blocking the opposite or perpendicular polarization.

BRIEF DESCRIPTION OF THE DRAWINGS

The invention will be better understood and objects other than those set forth above will become apparent when consideration is given to the following detailed description thereof. Such description makes reference to the annexed drawings, wherein.

DETAILED DESCRIPTION OF THE INVENTION

Figure 1:
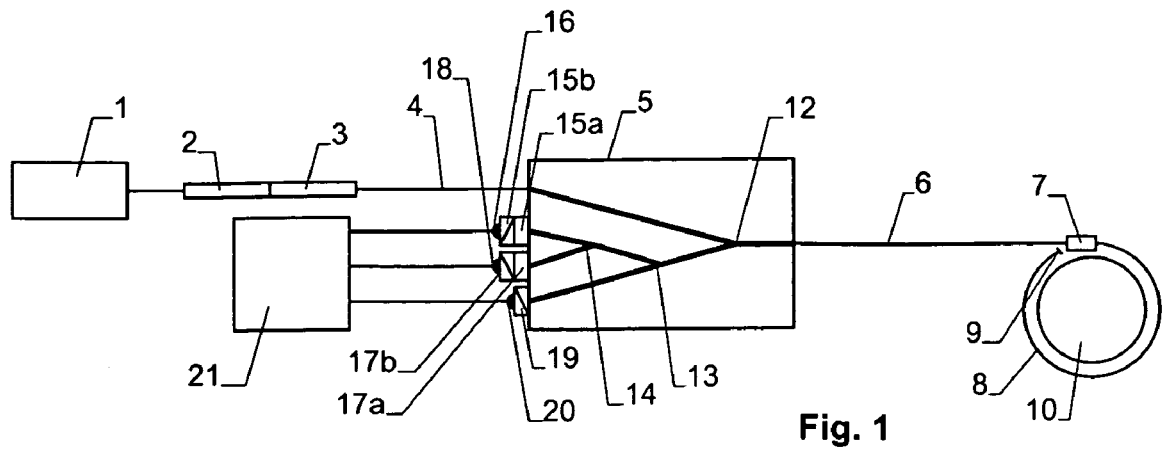
FIG. 1 is a first set-up for carrying out the method according to the present invention.

In the set-up of FIG. 1, light of a low-coherent broad-band source 1 (e.g. a superluminescent diode (SLD), a laser diode operated below threshold, an edge emitting LED (ELED), or a doped fiber light source), with a spectral width of e.g. some 10 nm, passes through a depolarizer 2 (e.g. a Lyot-type fiber polarizer as described in W. K. Burns, Degree of polarization in the Lyot depolarizer, Journal of Lightwave Technology LT-1, 475 (1983)). The light is subsequently polarized in a fiber polarizer 3. The depolarizer 2 can be omitted if an unpolarized light source is used.

The polarized light from polarizer 3 enters the polarization maintaining fiber (PMF) pigtail 4 of an integrated-optics beam splitter device 5 with its polarization direction parallel to the fast or slow axis of the PMF. The fiber is pigtailed to device 5 with it birefringent axes at +45° or −45° to the flat chip surface. Alternatively, fiber 4 is aligned at 0° or 90° to the chip surface. The waveguides of device 5 have preferably low birefringence.

The light exits from device 5 to a transmission fiber 6, which is a PMF with its birefringent axes aligned at +45° or −45° in respect to the axes of PMF pigtail 4. Hence, as a result, two orthogonally polarized light waves are launched into transmission fiber 6. They arrive at a quarter-wave retarder 7 at a first end of a sensing fiber 8. Retarder 7 converts the two linearly polarized waves to first left and right circularly polarized light waves, which propagate in sensing fiber 8 and are reflected at an end thereof by a mirror 9, thereby generating second right and left polarized light waves propagating back to retarder 7.

Sensing fiber 8 is wound at least once around a conductor 10. The magnetic field of a current through conductor 10 gives rise to a Faraday effect in sensing fiber 8, which in turn creates a phase shift $\Delta\phi$ between the right and left circularly polarized light waves returning to retarder 7.

The sensing fiber is advantageously prepared as described in EP 856 737 (a thermally annealed fiber, in case of small coil diameters of less than 300-500 mm) or packaged as described in EP 1 512 981 (in case of relatively large coil diameters and when flexible coils are desired).

In retarder 7, the second right and left linearly polarized light waves are converted to returning linear light waves oriented along the main axes of PMF 6. The polarization directions of the returning light waves are swapped with respects to the forward propagating waves in PMF 6.

In device 5, the returning light is split into several parts at three beam splitters 12, 13, 14. Three of these parts are used in subsequently described measurements.

A first part arrives at a first circular analyzer formed by a first quarter-wave retarder 15a and a first linear polarizer 15b, where quarter-wave retarder 15a has its fast and slow axes aligned parallel or orthogonally to the fast and slow axes of fiber 6, and polarizer 15b stands approximately under 45° thereto. The light exiting from first circular analyzer 15a, 15b, which is e.g. a left circular analyzer, is analyzed by a first light detector 16.

A second part of the returning light arrives at a second circular analyzer formed by a second quarter-wave retarder 17a and a second linear polarizer 17b, where quarter-wave retarder 17a has its fast and slow axes aligned parallel or orthogonally to the fast and slow axes of fiber 6, and polarizer 15b stands approximately under −45° thereto. The light exiting from second circular polarizer 17a, 17b, which is polarizing opposite to the first polarizer, is analyzed by a second light detector 18.

A third part of the returning light arrives at a linear polarizer 19 arranged at about 45° to the axes of PMF 6. The light from polarizer 19 is measured in a detector 20.

The signals measured by the detectors 16, 18 and 20 are fed to a signal processor 21.

In the following, the signals from the various detectors 16, 18, 20 are calculated.

The signals $I_+$ and $I_-$ from first detector 16 and second detector 18 are $$I_\pm = I_0 \cdot (1 \pm V \cdot \sin(\Delta\phi)), \quad (1)$$

where $I_0$ is proportional to the optical power arriving at the retarders/polarizers 15a, 17a and 19 and V is the interference fringe visibility (V is equal to unity at ideal conditions of interference). For simplicity, it is assumed that the splitting ratios of the beam splitters 12, 13, 14 are such that the optical power is the same in all exit channels. The phase shift $\Delta\phi$ is given by $$\Delta\phi = 4 \cdot K_V \cdot N \cdot I, \quad (2)$$

with $K_V$ being the Verdet constant (e.g. 1.0 μrad/A at 1310 nm), N is the number of sensing fiber loops, and I is the current. At 1310 nm and N=1, $\Delta\phi = \pm\pi/2$ corresponds to currents of about ±390 kA.

The retarders 15a, 17a introduce an approximately 90° phase offset between the two returning linear light waves. The two waves are brought to interference at the analyzers 15b, 17b. Due to the 90° phase shift, the interference signals after analyzers 15b and 17b vary in good approximation linearly with the magneto-optic phase shift (current), as long as the phase shift (current) is sufficiently small. At phase shifts $\Delta\phi$ approaching $\pm\pi/2$ or ±90°, a linearization of the sinusoidal transfer function in the signal processor 21 is necessary.

At small currents equation (1) becomes, in approximation, $$I_\pm = I_0 \cdot (1 \pm V \Delta\phi). \quad (3)$$

The signal I3 from detector 20 is as follows:

$$I_L = I_0 \cdot (1 + V \cos \Delta\phi). \quad (3a)$$

For small $\Delta\phi$, $I_L$ can be approximated by $$I_L = I_0 \cdot (1 + V). \quad (4)$$

For alternating currents, $\Delta\phi$ is equal to $$\Delta\phi = \Delta\phi_0 \cdot \sin(\omega t). \quad (5)$$

where $\Delta\phi_0$ is the amplitude of the magneto-optic phase modulation, ω is the current angular frequency and t is time.

Hence, the ac and dc components of Eq. (3) are $$I_{ac} = I_0 \cdot V \cdot \Delta\phi \quad (6)$$

$$I_{dc} = I_0. \quad (6a)$$

These values can be extracted in the signal processor 21. Dividing (6) by (6a) gives a signal ($V \cdot \Delta\phi$) which is proportional to the wave form of the current and independent of variations in the light intensity (for example due to source power variations or varying optical loss).

However, this method is restricted to ac currents only, and it is of limited accuracy. In the following, improved methods described.

In a first advantageous embodiment, the system of equations (1) and (4) is solved to obtain the value of $\Delta\phi$. Even though these equations have three unknowns ($I_0$, V and $\Delta\phi$), this is possible because there are three independent equations.

We can e.g. calculate $$S = (I+ - I-)/(I++ I-) \quad (7)$$

$$= V \cdot \sin(\Delta\phi) \quad (8)$$

In the linear approximation of equation (8), we have $$S = V \cdot \Delta\phi \quad (8a)$$

On the other hand, in linear approximation, $$S' = I_L/(I_+ + I_-) \quad (9)$$

$$= (1 + V) \text{ or}$$

$$V = S' - 1 \quad (9a)$$

Hence, we have $$\Delta\phi = S/V = S/(S'-1). \quad (10)$$

In other words, the signal S' can be used to compensate the signal S for variations in fringe visibility V.

The techniques shown here also allow for a compensation of the temperature dependence of the Faraday effect. Two mechanisms can be used, namely an "intrinsic compensation" and an "extrinsic compensation", both of which are explained in the following.

Intrinsic compensation:

The retardation ρ of the retarder 7 at the fiber coil commonly varies somewhat with temperature. For example, the retardation may decrease at a rate of $(1/\rho)(\delta\rho/\delta T) = -2.2 \cdot 10^{-4}$ °C.$^{-1}$ (see K. Bohnert et al., J. Lightwave Technology 20, 267-276, 2002). This affects the effective fringe visibility and hence the relationships for $I_\pm$ and $I_L$. If ε is the deviation of retarder 7 from π/2 one obtains from a Jones matrix description of the light propagation $$I_\pm = I_0 \cdot (1 \pm \cos \epsilon \cdot \sin \Delta\phi) \quad (11)$$

Here, ideal conditions of interference are assumed, i.e. V=1 for ε=0. For and small $\Delta\phi$, eq. (11) becomes $$I_\pm = I_0 \cdot (1 \pm \cos \epsilon \cdot \Delta\phi). \quad (12)$$

The variation of ε with temperature can be used to intrinsically compensate for the temperature dependence of the Verdet constant. The Verdet constant $K_V$, and hence $\Delta\phi$ at a given current, increase with temperature at a rate of $0.7 \cdot 10^{-4}$ °C.$^{-1}$. If the retarder is prepared with a room temperature retardation of about 77° (i.e. ε=−13°), the increase in $\Delta\phi$ is just balanced by the decrease in the cos ε term—i.e. the product $\Delta\phi_{comp} = \cos \epsilon \cdot \Delta\phi$ in eq. (12) becomes independent of the temperature (assuming that the retarder and the sensing fiber have equal temperature).

Note: With a temperature dependence of ρ given above, ρ decreases from about 78° (ε=−12°) to 76° (ε=−14°) if the temperature rises from −40° C. to 80° C. Hence, the (cos ε)-term decreases by a factor of 1.008, while the Verdet constant $K_V$ increases by about the same factor.

In K. Bohnert et al., J. Lightwave Technology 20, 267-276, 2002 and EP 1 115 000 an interferometric detection concept was used to measure the Faraday effect. Here, the retarder was also employed for intrinsic temperature compensation. In this case, the variation in the retardation on the recovered phase shift is used. For compensation the retardation must be set to about 100° if the same type of retarder is used.

Extracting the temperature signal from $I_L$:

Alternatively, the temperature can be extracted from the signal $I_L$ at detector 20, again using a retarder at the fiber coil differing from $\pi/2$. Assuming V=1, one obtains $$I_L = I_0 \cdot [(1+\cos^2 \epsilon)\cos^2(\Delta\phi/2)]. \quad (13)$$

Furthermore, $I_\pm$ are again $$I_\pm = I_0 \cdot (1 \pm \cos\epsilon \cdot \sin\Delta\phi). \quad (14)$$

At sufficiently small currents, eq. (13) becomes $$I_L = I_0 \cdot (1+\cos^2\epsilon). \quad (15)$$

Dividing $I_L$ by the sum $I_+ + I_-$ yields $$I'_L = I_L/(I_+ + I_-) = (1+\cos^2\epsilon) \quad (16)$$

Since $\epsilon$ varies with temperature, the signal I'L can be calibrated so that it becomes a measure for the temperature. For an unambiguous result $\epsilon$ must be chosen such that the retardation stays smaller than 90° or lager than 90° over the temperature range of operation. If the small current approximation is not valid, the signal IL of eq. (15) can be determined at the zero-crossings of an alternating current, where the term in $\cos^2(\Delta\phi/2)$ in (13) vanishes.

The ratio $(I_+ - I_-)/(I_+ + I_-)$ gives, for small currents:

$$(I_+ - I_-)/(I_+ + I_-) = \cos\epsilon \cdot \Delta\phi \quad (17)$$

The term $\cos\epsilon$ in (17) is obtained from (16), i.e. $\Delta\phi$ is expressed in terms for IL, I+ and I−.

$\Delta\phi$ is then temperature compensated in the signal processor using the temperature extracted from (16).

Further General Notes:

As described above, knowledge of the three signals $I_+$, $I_-$ and $I_L$ allows to obtain very accurate results for the phase shift $\Delta\phi$ and the current even if the values for V and $I_0$ not known in advance. It must be noted, however, that even the knowledge of two of the three signals $I_+$, $I_-$ and $I_L$ is advantageous over the prior art.

Figure 2:
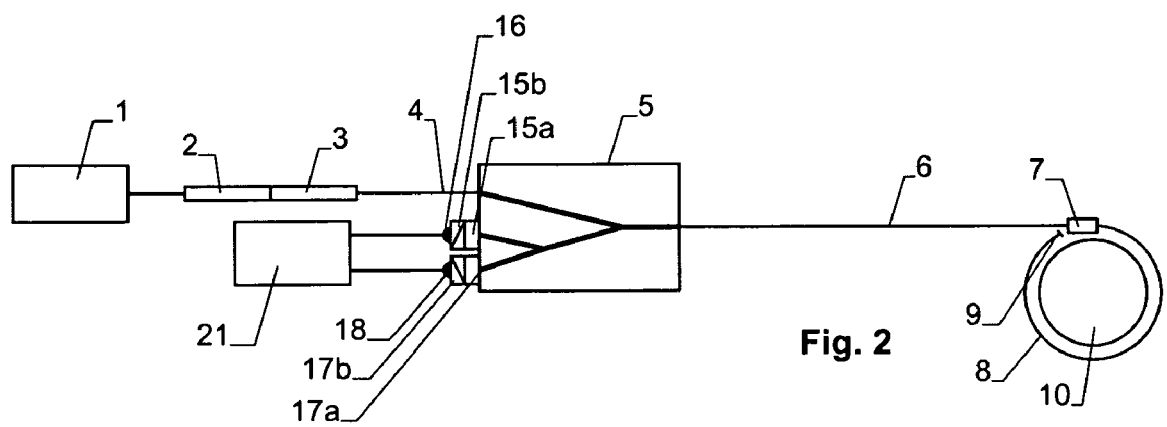
FIG. 2 is a second set-up for carrying out the method according to the present invention.

For example, FIG. 2 shows a device that measures $I_+$ and $I_-$ only. In this case, the calculation of S according to equation (8) allows to calculate $\Delta\phi$ under the assumption that V is known or has been measured in different manner.

On the other hand, a knowledge of $I_+$ and $I_L$ (or, equivalently, $I_-$ and $I_L$) allows again to eliminate $I_0$, e.g. by dividing $I_+$ by $I_L$ $$I_+/I_L = (1+V \cdot \sin(\Delta\phi))/(1+V). \quad (18)$$

Again, this allows a calculation of the phase shift $\Delta\phi$ assuming that V is known or has been measured in different manner.

Figure 3:
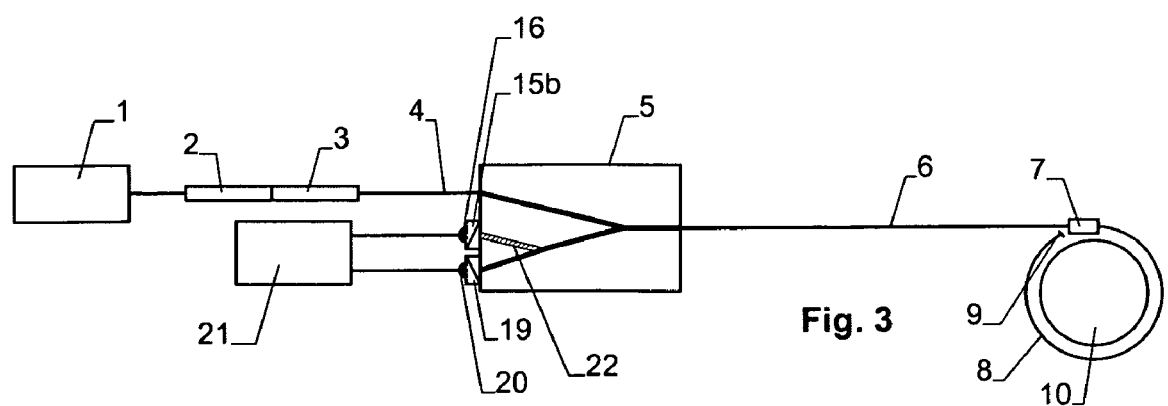
FIG. 3 is a third set-up for carrying out the method according to the present invention.

FIG. 3 shows a device suitable for carrying out this third embodiment of the invention.

FIG. 3 also shows an alternative to using the external retarder 15a (or 17a), namely by integrating a birefringent waveguide 22 with a phase shift of $\pi/2$, the light from which is directly fed to detector 16. The $\pi/2$ phase shift could also be in the entrance branch of the beam splitter for generating $I_+$ and $I_-$ after the analyzers.

It is known that UV exposure can alter the birefringence or introduce birefringence in optical waveguides, see e.g. Meyer, P.-A. Nicati, P. A. Robert, D. Varelas, H.-G. Limberger, and R. P. Salathe, Reversibility of photoinduced birefringence in ultralow-birefringence fibers, Optics Letters, 21, 1661 (1996), or T. Erdogan and V. Mizrahi, Characterization of UV-induced birefringence in "photosensitive Ge-doped silica optical fibers", Journal of the Optical Society of America B11, 2100 (1994). In the arrangement of FIG. 3, the waveguide 22 has been irradiated by UV radiation for generating a birefringence that introduces a $\pi/2$ phase shift.

In principle, the birefringence in the two legs of the splitter causing a $\pi/2$ phase retardation can also be achieved by other means, e.g. a somewhat non-circular geometry of the waveguide, a thinner surface layer above the waveguide, or built-in stress.

In the embodiments above, the signal $I_L$ was generated by sending the returning light through linear polarizer 19 before measuring it with a detector 20. It must be noted that polarizer 19 can also be omitted, in which case equation (4) would have to be replaced by $$I_L = I_0. \quad (19)$$

Again, equation (12) can be combined with the expressions for I+ and/or I− of equations (1) or (3) for calculating $\Delta\phi$ and/or V.

Instead of using an integrated beam splitter, such as device 5, the present method can also be carried out by means of discrete beam splitters, retarders and polarizers.

The invention has been described in reference to a sensing fiber with a mirror. However, it can also be applied to set-ups where the circular light waves pass through the sensing fiber only once.

What is claimed is:

1. A method for measuring a current comprising the steps of
    sending left and right circularly polarized light waves at least once along a sensing fiber extending around said current,
    passing said right and left circularly polarized light waves through an optical retarder for generating two orthogonally linearly polarized returning light waves,
    sending a first part of said returning light waves to a first detector, a second part of said returning light waves to a second detector, characterized by the step of
    sending a third part of said returning light waves to a third detector, wherein said first part of said returning light is passed through a first circular analyzer before impinging on said first detector, wherein said second part of said returning light waves is passed through a second circular analyzer before impinging on said second detector and having a polarization opposite to said first circular analyzer, and wherein said third part of said returning light waves is passed through a linear analyzer before impinging on said third detector,
    wherein said first detector generates a signal $I_+$ and said second detector generates a signal $I_-$ and said third detector generates a signal $I_L$, and knowledge of the three signals $I_+$, $I_-$, $I_L$ allows to obtain the current even if the values for fringe visibility V and arriving optical power $I_0$ are not known in advance.

2. The method of claim 1, said method further comprising the step of calculating $$S = (I_+ - I_-)/(I_+ + I_-)$$

and the step of calculating $$I_L/(I_+ + I_-).$$

3. The method of claim 2, wherein $$S = V \cdot \sin(\Delta\phi),$$

with $\Delta\phi$ being a phase shift introduced by Faraday-effect between said circularly polarized light waves in said sensing fiber and V describing an interference fringe visibility, wherein said method comprises the step of calculating $\Delta\phi$ from said signals $I_L$, $I_+$ and $I_-$.

4. The method of claim 3, wherein the signal $$S'=I_L/(I_++I_-),$$

is used to compensate the signal S for variations in fringe visibility V.

5. The method of claim 1, further comprising the step of estimating a temperature at said retarder, or a correction factor depending on said temperature, from said signals.

6. The method of claim 5, wherein said retarder has a phase shift not equal to 90° and/or wherein said temperature and/or said correction factor is estimated from $I_L/(I_++I_-)$, where $I_L$ is a signal generated by said third detector.

7. The method of claim 1, wherein said retarder has a phase shift equal to 90°+ϵ, with ϵ being a non-zero deviation, wherein said deviation is chosen such that cos ϵ·Δϕ becomes independent of temperature, with Δϕ being a phase shift introduced between the right and left circularly polarized light waves in said fibers.

8. The method of claim 6, wherein a deviation ϵ of the retarder from π/2 is present and the signal $$I_L'=I_L/(I_++I_-)=(1+\cos^2\epsilon),$$

is calibrated so that it becomes a measure for the temperature.

9. The method of claim 8, wherein the signal $I_L$ is determined at the zero-crossings of an alternating current.

10. The method of claim 1, wherein said first and/or second circular analyzer is comprised of a quarter wave retarder and a linear analyzer.

11. The method of claim 1, wherein said returning light waves are passed through an integrated optics device comprising at least one splitter for generating said first and said second part, and in particular at least two beam splitters.

12. The method of claim 11, wherein said integrated optics device comprises at least one integrated quarter-wave retarder cooperating with at least one external linear polarizer for forming said circular analyzer.

13. The method of claim 1, wherein said third part of said returning light waves is not passed through a linear analyzer before impinging on said third detector, and the signal $I_L$ generated at said third detector equals $I_0$, which is proportional to the arriving optical power.

14. The method of claim 1, wherein for small currents $$I_+=I_0(1+V\cdot\Delta\phi),$$

$$I_-=I_0(1-V\cdot\Delta\phi),$$

and for alternating currents, the ac and dc components of the signals $I_+$ and $I_-$ are extracted in a signal processor and the quotient of the ac and dc components gives a signal V·Δϕ proportional to the wave form of the current and independent of variations in the light intensity.

15. The method of claim 1, wherein no ac phase modulators are present.

16. A method for measuring a current comprising the steps of sending left and right circularly polarized light waves at least once along a sensing fiber extending around said current, passing said right and left circularly polarized light waves through an optical retarder for generating two orthogonally linearly polarized returning light waves, sending a first part of said returning light waves to a first detector, characterized by the step of passing said first part of said returning light through a first circular analyzer before impinging on said first detector, passing a further part of said returning light waves through a linear analyzer before impinging on a further detector, wherein said first detector generates a signal $I_+$ or $I_-$ and said further detector generates a signal $I_L$, and knowledge of the two signals $I_+$ or $I_-$ and $I_L$ allows to eliminate an arriving optical power $I_0$ and to calculate the phase shift Δϕ assuming that a fringe visibility V is known or has been measured in different manner.

17. The method of claim 16 comprising the step of dividing $I_+$ by $I_L$ $$I_+/I_L=(1+V\cdot\sin(\Delta\phi))/(1+V).$$

\* \* \* \* \*